United States Patent
Sarin et al.

(10) Patent No.: US 7,864,584 B2
(45) Date of Patent: Jan. 4, 2011

(54) EXPANDED PROGRAMMING WINDOW FOR NON-VOLATILE MULTILEVEL MEMORY CELLS

(75) Inventors: Vishal Sarin, Cupertino, CA (US); Jung Sheng Hoei, Newark, CA (US); Frankie F. Roohpavar, Monte Sereno, CA (US)

(73) Assignee: Micron Technology, Inc., Boise, ID (US)

( * ) Notice: Subject to any disclaimer, the term of this patent is extended or adjusted under 35 U.S.C. 154(b) by 346 days.

(21) Appl. No.: 11/799,657

(22) Filed: May 2, 2007

(65) Prior Publication Data

US 2008/0273395 A1 Nov. 6, 2008

(51) Int. Cl.
G11C 16/26 (2006.01)
(52) U.S. Cl. .................. 365/185.18; 365/185.22; 365/185.25; 365/185.03; 365/185.17; 365/185.27
(58) Field of Classification Search ............ 365/185.02, 365/185.03, 185.17, 185.27, 185.19, 185.18, 365/185.22, 185.25, 185.33
See application file for complete search history.

(56) References Cited

U.S. PATENT DOCUMENTS

| | | | |
|---|---|---|---|
| 5,959,891 A | 9/1999 | Sansbury | |
| 5,973,967 A * | 10/1999 | Nguyen et al. | 365/189.05 |
| 6,154,391 A | 11/2000 | Takeuchi et al. | |
| 6,259,635 B1 * | 7/2001 | Khouri et al. | 365/189.09 |
| 6,643,188 B2 | 11/2003 | Tanaka et al. | |
| 6,975,537 B2 * | 12/2005 | Lutze et al. | 365/185.18 |
| 7,031,210 B2 | 4/2006 | Park et al. | |
| 7,366,018 B2 * | 4/2008 | Shibata | 365/185.18 |
| 7,508,711 B2 * | 3/2009 | Goda | 365/185.17 |
| 2005/0105333 A1 | 5/2005 | Park et al. | |
| 2006/0133150 A1 | 6/2006 | Shibata | |
| 2008/0273384 A1 * | 11/2008 | Sarin et al. | 365/185.03 |

FOREIGN PATENT DOCUMENTS

EP 0 449 610 A2 10/1991

OTHER PUBLICATIONS

International Search Report (4 pgs.).

* cited by examiner

*Primary Examiner*—Andrew Q Tran
(74) *Attorney, Agent, or Firm*—Brooks, Cameron & Huebsch, PLLC

(57) ABSTRACT

Embodiments of the present disclosure provide methods, devices, modules, and systems for utilizing an expanded programming window for non-volatile multilevel memory cells. One method includes associating a different logical state with each of a number of different threshold voltage (Vt) distributions. In various embodiments, at least two Vt distributions include negative Vt levels. The method includes applying a read voltage to a word line of a selected cell while applying a pass voltage to word lines of unselected cells, applying a boost voltage to a source line coupled to the selected cell, applying a voltage greater than the boost voltage to a bit line of the selected cell, and sensing a current variation of the bit line in response to the selected cell changing from a non-conducting state to a conducting state.

22 Claims, 6 Drawing Sheets

US 7,864,584 B2

EXPANDED PROGRAMMING WINDOW FOR NON-VOLATILE MULTILEVEL MEMORY CELLS

TECHNICAL FIELD

The present disclosure relates generally to semiconductor devices and, more particularly, to memory devices having non-volatile memory cells.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory, among others.

Flash memory devices are utilized as non-volatile memory for a wide range of electronic applications. Flash memory devices typically use a one-transistor memory cell that allows for high memory densities, high reliability, and low power consumption.

Uses for flash memory include memory for personal computers, personal digital assistants (PDAs), digital cameras, and cellular telephones. Program code and system data, such as a basic input/output system (BIOS), are typically stored in flash memory devices. This information can be used in personal computer systems, among others.

Two common types of flash memory array architectures are the "NAND" and "NOR" architectures, so called for the logical form in which the basic memory cell configuration of each is arranged A NAND array architecture arranges its array of floating gate memory cells in a matrix such that the gates of each floating gate memory cell of the array are coupled by rows to word select lines. However each memory cell is not directly coupled to a column bit line by its drain. Instead, the memory cells of the array are coupled together in series, source to drain, between a source line and a column bit line.

Memory cells in a NAND array architecture can be configured, e.g., programmed, to a desired state. That is, electric charge can be placed on or removed from the floating gate of a memory cell to put the cell into a number of stored states. For example, a single level cell (SLC) can represent two binary states, e.g., 1 or 0. Flash memory cells can also store more than two binary states, e.g., 1111, 0111, 0011, 1011, 1001, 0001, 0101, 1101, 1100, 0100, 0000, 1000, 1010, 0010, 0110, and 1110. Such cells may be referred to as multi state memory cells, multibit cells, or multilevel cells (MLCs). MLCs can allow the manufacture of higher density memories without increasing the number of memory cells since each cell can represent more than one bit. MLCs can have more than one programmed state, e.g., a cell capable of representing four bits can have fifteen programmed states and an erased state.

The state of a memory cell, e.g., the data stored in the cell, is determined by the threshold voltage (Vt) of the cell. A MLC includes multiple Vt distribution ranges within a programming window. The programming window represents the voltage range within which the Vts of the memory cells are electrically altered to represent the different logical states. As an example, a programming window can have a lowermost voltage of about −3V and an uppermost voltage of about 3V.

In MLCs, the memory density depends on the number Vt distributions within the programming window, but the Vt distributions must be sufficiently spaced apart so as to reduce the possibility of a higher voltage of one distribution overlapping a lower Vt of the next distribution. For a given programming window, an increase in the number of Vt distributions, e.g., program states, leads to an increase in the number of bits a cell can represent.

One method to utilize the full range of a given programming window, e.g., from −3V to 3V, can include applying negative voltages to word lines of selected cells in order to read and/or verify the Vt levels of the cells programmed to negative Vt levels. However, supplying negative voltages via word line drivers can add circuit complexity and can increase power consumption, among various other problems.

DETAILED DESCRIPTION

Figure 1:
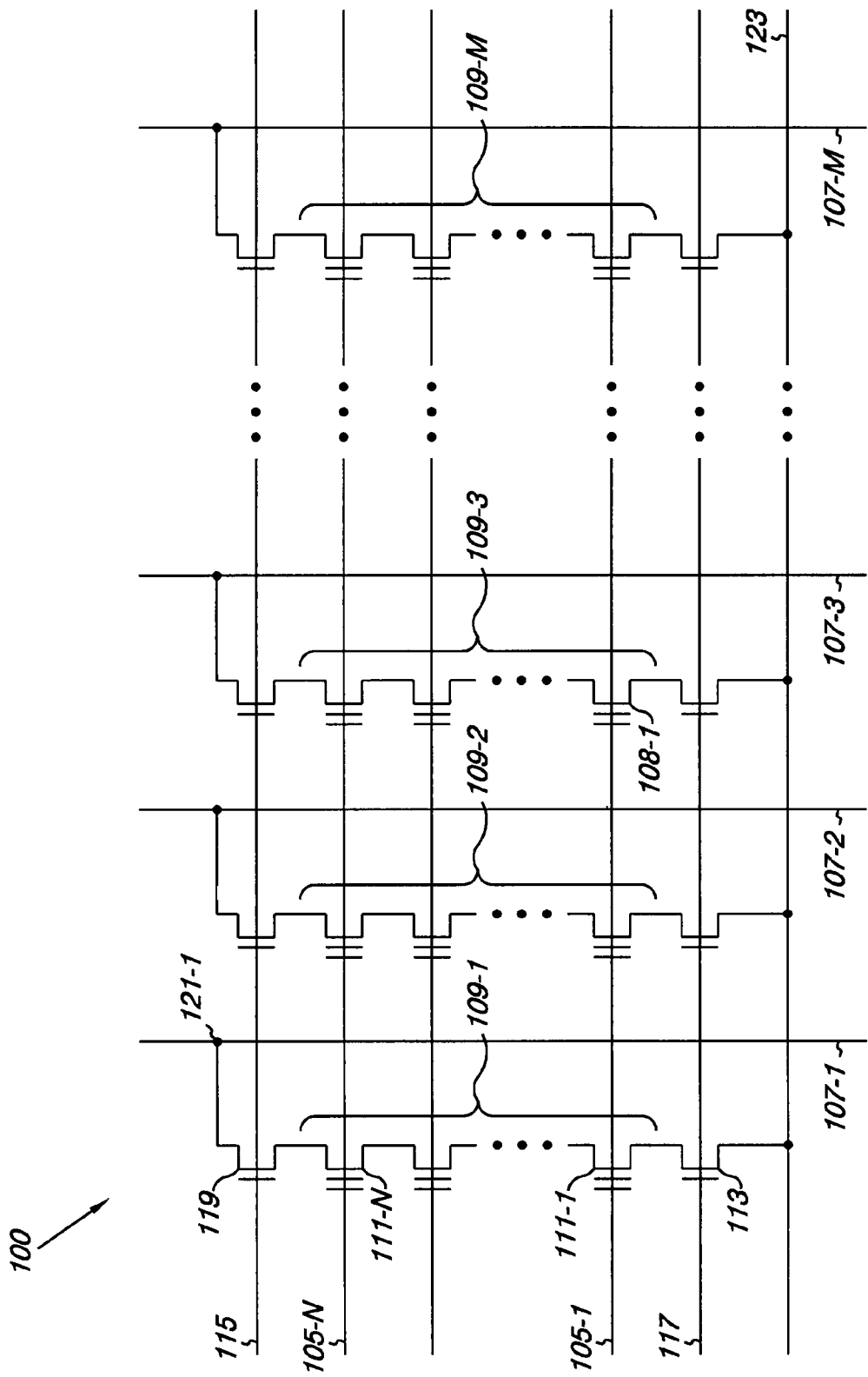
FIG. 1 is a schematic of a portion of a non-volatile memory array that can be used with embodiments of the present disclosure.

Embodiments of the present disclosure provide methods, devices, modules, and systems for utilizing an expanded programming window for non-volatile multilevel memory cells. One method includes associating a different logical state with each of a number of different threshold voltage (Vt) distributions. In various embodiments, at least two Vt distributions include negative Vt levels. The method includes applying a read voltage to a word line of a selected cell while applying a pass voltage to word lines of unselected cells, applying a boost voltage to a source line coupled to the selected cell, applying a voltage greater than the boost voltage to a bit line of the selected cell, and sensing a current variation of the bit line in response to the selected cell changing from a non-conducting state to a conducting state.

In various embodiments, the voltage applied to the bit line of the selected cell can be a precharged voltage. In such embodiments, the method can include sensing a voltage variation of a bit line node in response to the selected cell changing from the non-conducting state to the conducting state. That is, the precharged voltage applied to the bit line can discharge when the selected cell changes from a non-conducting state to a conducting state and a voltage of a bit line node can be monitored to determine a Vt level of the selected cell.

An embodiment of a non-volatile memory device includes an array of non-volatile multilevel memory cells arranged in rows coupled by word lines and columns coupled by bit lines and control circuitry coupled to the array and configured to execute a method for determining cell threshold voltage (Vt) levels of cells programmed from an erased Vt level to a programmed Vt level of a number of positive and negative programmed Vt levels. In this embodiment, the method can include applying a read voltage to a word line of a selected cell while applying a pass voltage to a number of word lines of unselected cells, applying a ground potential to a well region of a semiconductor substrate in which the selected cell is formed, applying a boost voltage to a source line coupled to the selected cell, and applying a voltage greater than the boost voltage to a bit line of the selected cell. The method includes sensing a current variation of the bit line in response to the selected cell changing from a non-conducting state to a conducting state.

In such embodiments, the Vt of a selected cell can be determined during a program verify operation such that the read voltage is a verify voltage corresponding to one of the number of positive and negative programmed Vt levels. In some embodiments, the boost voltage is 1V to 2V, the erased Vt level is −2V to −4V, an uppermost positive programmed Vt level is 2V to 4V, and the read voltage is between 0V and the sum of the uppermost positive programmed Vt level and the boost voltage.

In the following detailed description of the present disclosure, reference is made to the accompanying drawings that form a part hereof, and in which is shown by way of illustration how various embodiments of the disclosure may be practiced. These embodiments are described in sufficient detail to enable those of ordinary skill in the art to practice the embodiments of this disclosure, and it is to be understood that other embodiments may be utilized and that process, electrical, or mechanical changes may be made without departing from the scope of the present disclosure.

As used herein the terms "wafer" and "substrate" may include a number of semiconductor-based structures that have an exposed semiconductor surface. Structure can be understood to include silicon, silicon-on-insulator (SOI), silicon-on sapphire (SOS), doped, and undoped semiconductors. In addition, structure can be understood to include epitaxial layers of silicon supported by a base semiconductor foundation. The base semiconductor foundation is typically the lowest layer of silicon material on a wafer or a silicon layer deposited on another material. When reference is made to "wafer" and "substrate" in the following description, previous process steps may have been utilized to form regions or junctions in or on the semiconductor structure and/or foundation.

FIG. 1 is a schematic of a portion of a non-volatile memory array that can be used with embodiments of the present disclosure. The embodiment shown in FIG. 1 illustrates a NAND architecture non-volatile memory. However, embodiments described herein are not limited to this example. As shown in FIG. 1, the memory array 100 includes word lines 105-1, . . . , 105-N and intersecting bit lines 107-1, . . . , 107-M. For ease of addressing in the digital environment, the number of word lines 105-1, . . . , 105-N and the number of bit lines 107-1, . . . , 107-M are each some power of two, e.g., 256 word lines by 4,096 bit lines.

Memory array 100 includes NAND strings 109-1, . . . , 109-M. Each NAND string includes non-volatile memory cells 111-1, . . . , 111-N, each located at an intersection of a word line 105-1, . . . , 105-N and a local bit line 107-1, . . . , 107-M. The non-volatile memory cells 111-1, . . . , 111-N of each NAND string 109-1, . . . , 109-M are connected in series source to drain between a source select gate (SGS), e.g., a field-effect transistor (FET) 113, and a drain select gate (SGD), e.g., FET 119. Source select gate 113 is located at the intersection of a local bit line 107-1 and a source select line 117 while drain select gate 119 is located at the intersection of a local bit line 107-1 and a drain select line 115.

As shown in the embodiment illustrated in FIG. 1, a source of source select gate 113 is connected to a common source line 123. The drain of source select gate 113 is connected to the source of the memory cell 111-1 of the corresponding NAND string 109-1. The drain of drain select gate 119 is connected to the local bit line 107-1 for the corresponding NAND string 109-1 at drain contact 121-1. The source of drain select gate 119 is connected to the drain of the last memory cell 111-N, e.g., floating-gate transistor, of the corresponding NAND string 109-1.

In various embodiments, construction of non-volatile memory cells, 111-1, . . . , 111-N, includes a source, a drain, a floating gate or charge storage layer, and a control gate. Non-volatile memory cells, 111-1, . . . , 111-N, have their control gates coupled to a word line, 105-1, . . . , 105-N, respectively. A column of the non-volatile memory cells, 111-1, . . . , 111-N, make up the NAND strings, e.g., 109-1, . . . , 109-M, coupled to a given local bit line, e.g., 107-1, . . . , 107-M, respectively. A row of the non-volatile memory cells are commonly coupled to a given word line, e.g., 105-1, . . . , 105-N. Embodiments of the present disclosure are not limited to a particular type of array architecture. For example, embodiments may also operate properly in NOR and/or AND architecture array. An AND array architecture would be similarly laid out except that the string of memory cells would be coupled in parallel between the select gates.

In operation, the word lines 105-1, . . . , 105-N select the individual floating gate memory cells 111-1, . . . , 111-N in the strings 109-1, . . . , 109-M to be written to or read from and operate the remaining, e.g., unselected, floating gate memory cells 111-1, . . . , 111-N in each string 109-1, . . . , 109-M in a pass through mode.

During a prior art programming operation, the selected word line for the memory cell to be programmed can be biased with a series of incrementing voltage programming pulses that start at an initial voltage that is greater than a predetermined programming voltage, e.g., approximately 16V. The unselected word lines for the remaining cells can be biased at a voltage, e.g., a pass through voltage, that is less than the programming voltage, e.g., approximately 10V, during the program operation. The unselected word line voltage is not limited to a particular pass through voltage.

After each programming pulse, a verification operation can be performed by sequentially applying different verify voltages, e.g., 0.2V, 0.5V, 1.2V, 2.2V to the selected word line to determine if the Vt of the selected cell has increased to a Vt level corresponding to a desired program level, e.g., a Vt level that correspond to a particular programmed state such as "10," "00," "01," "1101," "0011," etc. The programming/verifying of the other memory cells can occur in a similar manner.

A prior art read operation can be conducted by sequentially supplying different read voltages, e.g., 0V, 1V, 2V to the selected word line. A pass voltage, e.g., 4.5V, that makes the unselected memory cells electrically conductive, e.g., places the unselected memory cells in a conductive state, can be supplied to the unselected word lines, and a ground potential, e.g., 0V, can be applied to the common source line to which the selected cell is connected and to the semiconductor substrate, e.g., P-well or N-well region, in which the selected cell is formed.

Figure 2A:
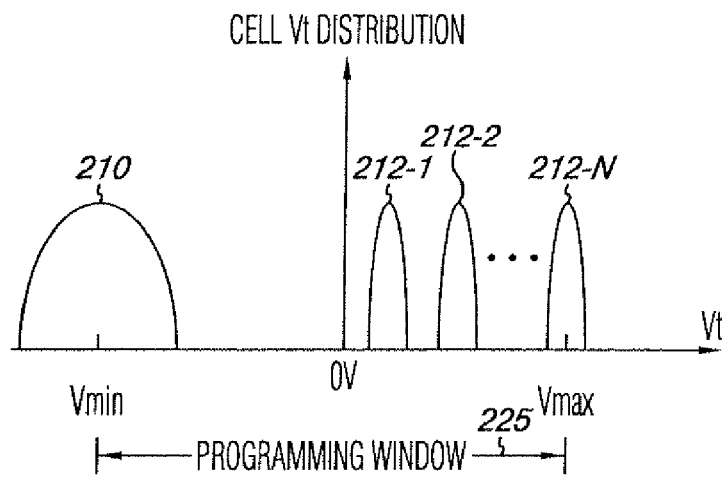
FIG. 2A illustrates a diagram of memory cell Vt distributions according to the prior art.
Figure 2B:
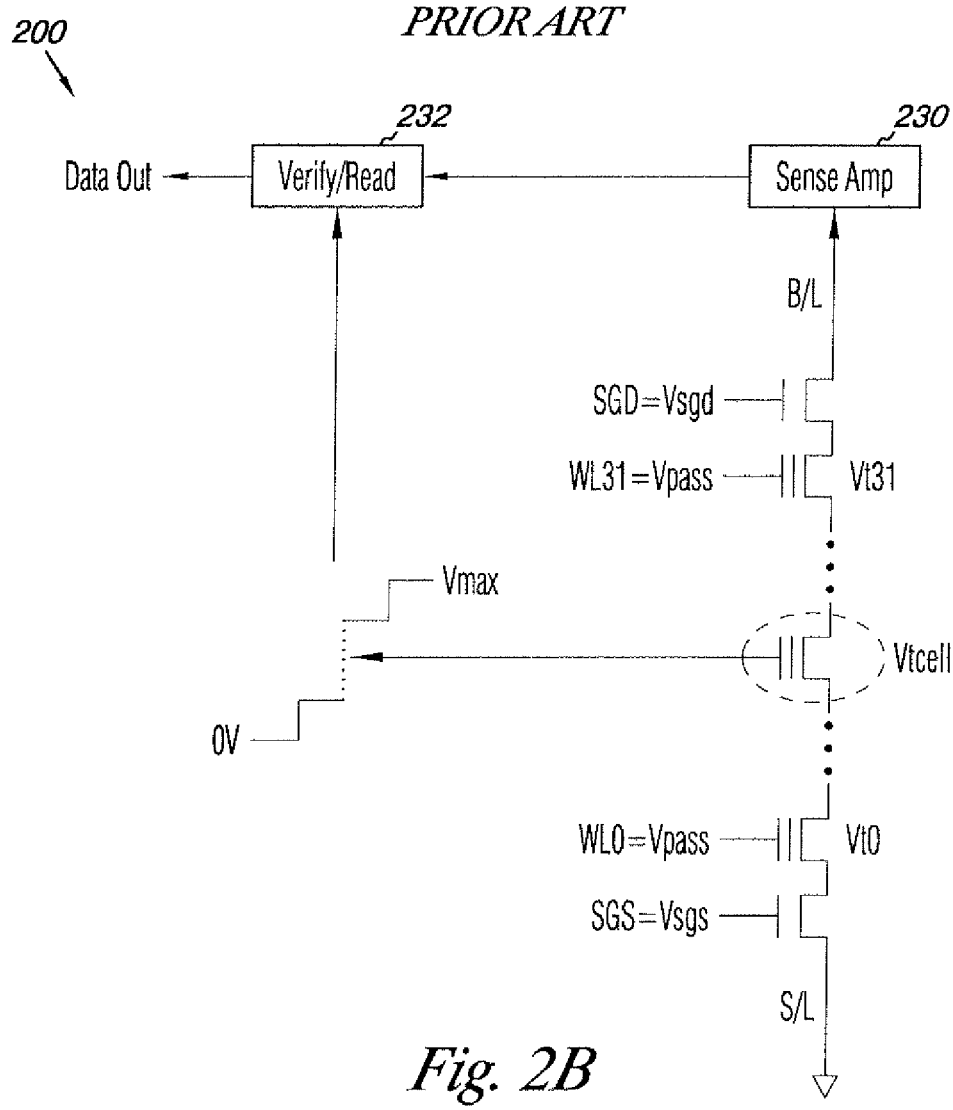
FIG. 2B illustrates a diagram of sense and read circuitry according to the prior art.

In such read operations, sense and read circuitry, e.g., circuitry 200 shown in FIG. 2B, can be used to detect when the selected cell changes from an electrically non-conducting state to an electrically conducting state, e.g., when the gate-to-source voltage reaches a value greater than the Vt level of the selected cell. That is, the changing or switching of the selected cell to the conducting state can occur when the gate-to-source voltage, e.g., Vgs, of the selected cell transitions from a value less than the Vt of the selected cell to a value greater than the Vt of the selected cell in response to a particular applied read voltage. The transition from the non-conducting to the conducting state can be detected as a voltage or current variation on the bit line, e.g., drain node, of the selected cell. In this manner, the sense and read circuitry can be used to determine the Vt of the selected cell, which can indicate a particular program state, or data, stored in the selected cell.

FIG. 2A illustrates a diagram of memory cell Vt distributions according to the prior art. FIG. 2B illustrates a diagram of prior art sense and read circuitry 200 that can be used to determine the Vt of a selected memory cell, e.g., Vtcell. In the embodiment shown in FIG. 2B, the selected memory cell is a part of a NAND string, e.g., string 109-1 to 109-M as shown in FIG. 1, which includes 32 memory cells coupled to respective word lines, e.g., WL0 to WL31 as shown. Each of the 32 memory cells in the string has an associated Vt, e.g., Vt0 to Vt31. Embodiments of the present disclosure are not limited to a NAND architecture or to a particular number of memory cells per string.

FIG. 2A illustrates a number of Vt distributions 210, 212-1, 212-2, . . . , 212-N within a programming window 225. The programming window 225 represents a range of voltage levels, e.g., Vmin to Vmax, to which the Vts of the memory cells can be electrically altered in order to represent a number of different states. As an example Vmin can be about −3V and Vmax can be about 3V. As one of ordinary skill in the art will appreciate, the programming window 225, e.g., Vmin and Vmax values, can vary based on design and/or reliability considerations, among various other factors.

In FIG. 2A, the Vt distribution 210 represents an erased state and Vt distributions 212-1 to 212-N represent a number of programmed states. As illustrated, each of the programmed states 212-1 to 212-N are positive programmed states. As used herein, a positive programmed state refers to a Vt distribution, e.g., 212-1 to 212-N, which corresponds to a range of positive memory cell Vt levels associated with a particular binary state, e.g., "01," "1110," etc.

As mentioned above, the Vt level of a selected cell, e.g., Vtcell, can be read or verified by sequentially supplying different read voltages, e.g., voltages from 0V to Vmax as shown in FIG. 2B, to the selected word line until the gate-to-source voltage of the selected cell changes such that the selected cell switches from a non-conducting state to a conducting state. A pass voltage, e.g., Vpass as shown, that makes the unselected memory cells electrically conductive, can be supplied to the unselected word lines. A ground potential, e.g., 0V, can be applied to the common source line, e.g., S/L, and to the semiconductor substrate, e.g., P-well or N-well region, in which the selected cell is formed.

The sense and read circuitry 200 can be used to detect when the selected cell changes from the electrically non-conducting state to the electrically conducting state. For example, a sense amplifier 230 can detect a current or voltage variation on the bit line, e.g., B/L, when the selected cell becomes electrically conductive, e.g., when the Vgs of the selected cell switches from a value less than the Vt of the selected cell to a value greater than the Vt of the selected cell in response to a particular read voltage applied to the selected word line. The sense amplifier 230 can signal read/verify circuitry 232 when the selected cell becomes conductive. The read/verify circuitry 232 can then determine the Vt of the selected cell and can indicate the data, e.g., the binary logic state, stored by the selected cell based on the particular read voltage applied to the selected cell.

However, prior art sensing methods such as that described in connection with FIGS. 2A and 2B do not effectively utilize the programming window 225. For example, such prior sensing methods and/or sense and read circuitry, e.g., 200, may not allow for non-volatile memory cells to be programmed to program states having negative Vt levels, e.g., Vt levels less than 0V, without the use of negative applied read potentials.

For example, in order for the sense and read circuitry 200 to determine the Vt of a selected cell, e.g., Vtcell, which has a negative Vt, a negative voltage would need to be applied to the selected word line. For instance, when the Vt of the selected cell is a negative value, the gate-to-source voltage (Vgs) of the selected cell is greater than the Vt of the cell for each applied read voltage from 0V to Vmax. That is, the selected cell is in the conducting state, e.g., Vgs greater than the Vt of the selected cell, for each applied read voltage. As such, the selected cell is always in a conducting state for the read/verify operation so the sense and read circuitry 200 does not detect a transition from the non-conducting to the conducting state.

Figure 3A:
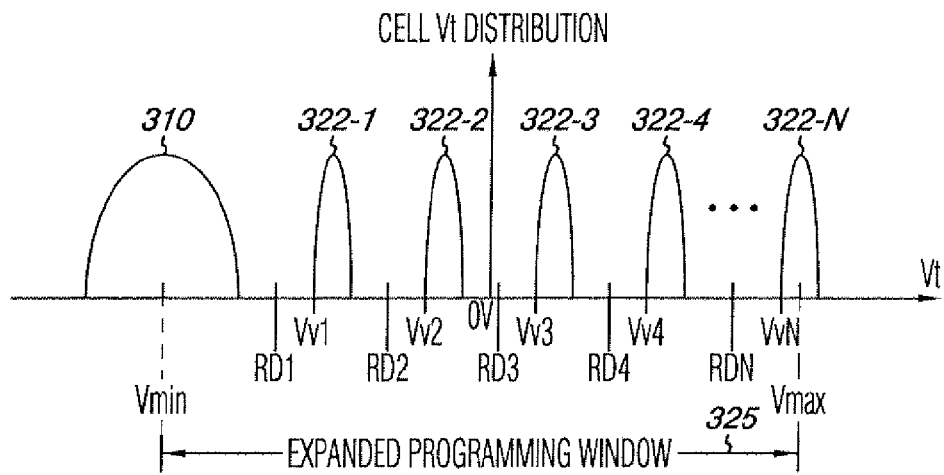
FIG. 3A illustrates a diagram of memory cell Vt distributions according to an embodiment of the present disclosure.
Figure 3B:
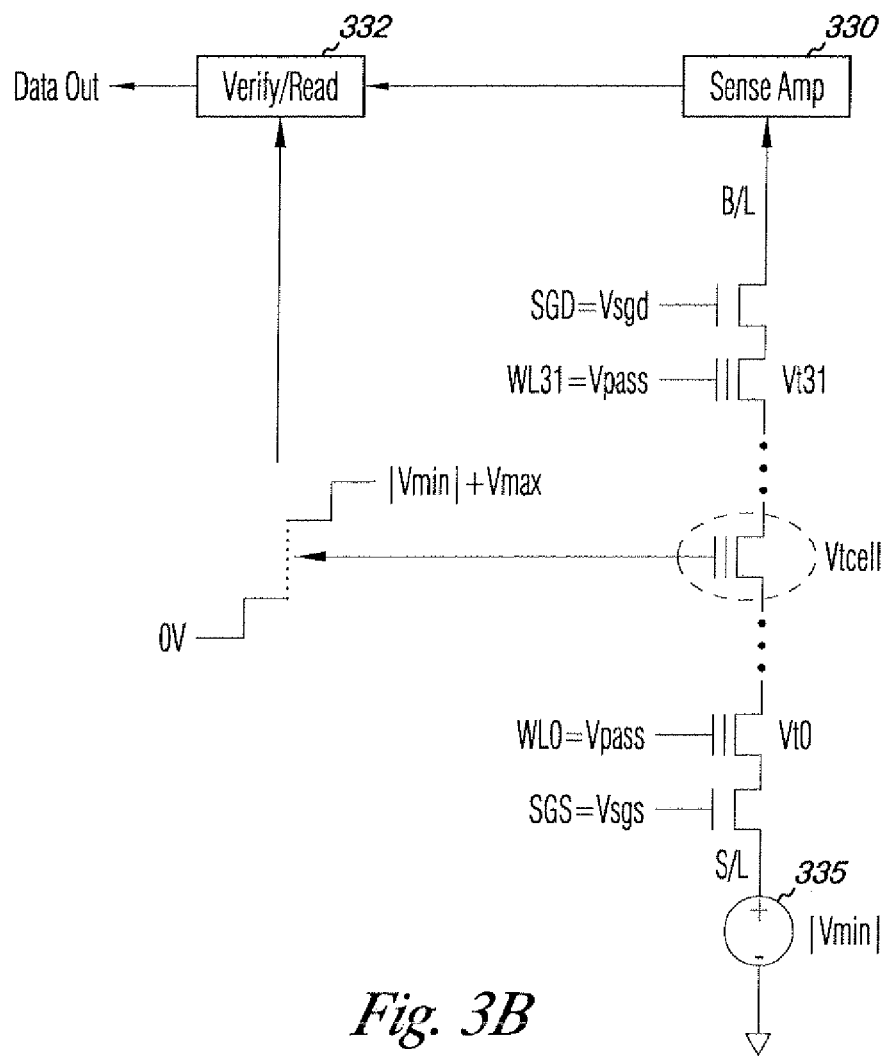
FIG. 3B illustrates a diagram of sense and read circuitry according to an embodiment of the present disclosure.

Read and/or verify operations which require application of a negative voltage to the selected cell can result in problems such as added circuit complexity, increased power consumption, and/or process technology changes, among various other problems. FIGS. 3A and 3B illustrate a diagram of Vt distributions and sense and read circuitry, respectively, according to an embodiment of the present disclosure. The embodiment illustrated in FIGS. 3A and 3B represent an expanded programming window 325 for non-volatile multi-level memory cells.

FIG. 3A illustrates a number of Vt distributions 310, 322-1, 322-2, 322-3, 322-4, . . . , 322-N within a programming window 325. The programming window 325 represents a range of voltage levels, e.g., Vmin to Vmax, to which the Vts of the memory cells can be electrically altered in order to represent a number of different states. As an example Vmin can be about −3V and Vmax can be about 3V. The programming window 325, e.g., Vmin and Vmax values, can vary based on design and/or reliability considerations, among various other factors. As used in FIGS. 3A and 3B, Vmin represents an erased Vt level and Vmax represents an uppermost positive programmed Vt level.

In FIG. 3A, the Vt distribution 310 represents an erased state or an erased level and Vt distributions 322-1 to 322-N represent a number of programmed states or programmed levels. As illustrated, each of the programmed states 322-1 to 322-N include both positive programmed states, e.g., 322-3, 322-4, . . . , 322-N, and negative programmed states, e.g., 322-1 and 322-2. As used herein, a negative programmed state refers to a Vt distribution, e.g., 322-1 to 322-N, which corresponds to a range of negative memory cell Vt levels associated with a particular binary logic state, e.g., "01," "1110," etc. Embodiments are not limited to a particular number of positive and/or negative programmed states. For instance, although FIG. 2A illustrates two negative programmed states 322-1 and 322-2, various embodiments can include more or fewer than two negative programmed states.

In operation, non-volatile memory cells such as those illustrated in the NAND string of FIG. 3B can be simultaneously erased. That is their Vt levels, e.g., Vt0 to Vt31 as shown in FIG. 2B, can be brought to an erase Vt level within the erase Vt distribution 310. The Vts of the memory cells can then be increased, e.g., programmed, from out of the erase Vt distribution 310 to within one of the program Vt distributions 322-1 to 322-N. As one of ordinary skill in the art will appreciate, programming the cells from out of the erase distribution 310 into a different distribution 322-1 to 322-N can include applying a number of programming pulses to a selected word line, e.g., WL0 to WL31.

In the embodiment illustrated in FIG. 3B, each program Vt distribution 322-1, 322-2, 322-3, 322-4, . . . , 322-N has a corresponding verify voltage Vv1, Vv2, Vv3, Vv4, . . . , VvN and a corresponding read reference voltage RD1, RD2, RD3, RD4, . . . , RDN. For memory cells to be programmed into Vt distribution 322-1 from erase distribution 310, the application of programming pulses is terminated when their Vt become equal to or greater than the verify level Vv1. Similarly, for cells to be programmed into one of the other Vt distributions 322-2 to 322-N, the application of programming pulses is terminated when their Vt become equal to or greater than the respective verify level Vv2 to VvN. As described above, a program verify operation can be performed after each programming pulse to determine whether the Vt of selected cells have reached the verify voltage, e.g., Vv1 to VvN, corresponding to the desired program distribution, e.g., 322-1 to 322-N. As described further below, during a program verify operation, the sense and read circuitry 300 can be used to determine the Vt of cells having positive Vt levels and of cells having negative Vt levels during program verify operations.

In various embodiments, and as illustrated in FIG. 3A, the individual program verify levels Vv1 to VvN are coincident with the lower margins of their respective distribution ranges 322-1 to 322-N. However, as one of ordinary skill in the art will appreciate, the program verify levels can be less than the lower margins in some cases.

The embodiment shown in FIG. 3A also illustrates the read reference voltages RD1, RD2, RD3, RD4, . . . , RDN used to determine into which of the program Vt distributions 322-1, 322-2, 322-3, 322-4, . . . , 322-N a cell has been programmed. The read reference voltage levels RD1 to RDN are reference voltages used to read the respective program states of the cells, e.g., "01", "00" and "10".

During a read operation, the read reference voltages RD1 to RDN are the voltage levels with which the Vt of a memory cell being read is compared. In various embodiments, the read reference voltages RD1 to RDN can be positioned roughly halfway between adjacent Vt distribution ranges 322-1 to 322-N. As an example, RD1 may be about −2.5V, RD2 may be about −1.5V, RD3 may be about 0.2V, RD4 may be about 1V, and RDN may be about 2.4V. Also, the program verify voltages Vv1, Vv2, Vv3, Vv4, and VvN associated with the read reference voltages RD1, RD2, RD3, RD4, and RDN, respectively, may have respective voltages of about −2.2V, −1.2V, 0.5V, 1.4V, and 2.2V. Embodiments are not limited to particular program verify voltages and/or particular reference read voltages.

The sense and read circuitry 300 illustrated in FIG. 3B can be used to determine the Vts of memory cells having a negative Vt level and of memory cells having a positive Vt level. In various embodiments, a determined Vt of a cell can be compared with a program verify level, e.g., Vv1 to VvN, or with a read reference voltage, e.g., RD1 to RDN, associated with a particular Vt distribution, e.g., 322-1 to 322-N, corresponding to a particular logical program state represented by the cell.

In various embodiments, determining the Vt of a selected cell, e.g., Vtcell as shown in FIG. 3B, includes applying a read voltage to the word line, e.g., the control gate, of the selected cell during a read or program verify operation. As shown in FIG. 3B, in various embodiments, the applied read voltage is a positive voltage from a lowermost voltage, e.g., 0V, to an uppermost voltage, e.g., the sum of Vmax and the absolute value of Vmin in this embodiment. The applied read voltage can be gradually increased from the lowermost to the uppermost voltage until the operation is complete, e.g., until sense amplifier 330 detects a voltage or current variation on the bit line B/L due to the selected cell switching from a non-conducting to a conducting state.

As one of ordinary skill in the art will appreciate, in various embodiments, the voltage applied to the bit line of the selected cell can be a precharged voltage. That is, the bit line can be precharged to a voltage above the boost voltage applied to common source line, e.g., source line 123 described in connection with FIG. 1. In such embodiments, the voltage of a bit line node, e.g., node 121-1 shown in FIG. 1, can be monitored to determine when the selected cell changes from the non-conducting state to the conducting state. For instance, the precharged voltage applied to the bit line can discharge when the selected cell changes from a non-conducting state to a conducting state and a voltage of the bit line node can be monitored to determine a Vt level of the selected cell.

Embodiments are not limited to a particular lowermost or uppermost applied read voltage or range of read voltages. For instance, as described further below, the lowermost applied read voltage can be greater than 0V depending on factors such as the location of a lowermost negative program Vt distribution, e.g., 322-1, and/or the voltage applied to the source line of the selected cell during a read operation, etc. In embodiments in which the uppermost read voltage is the sum of Vmax and the absolute value of Vmin, the sense and read circuitry 300 can determine the Vt of cells whose Vt is within programming window 325 shown in FIG. 3A.

Figure 4:
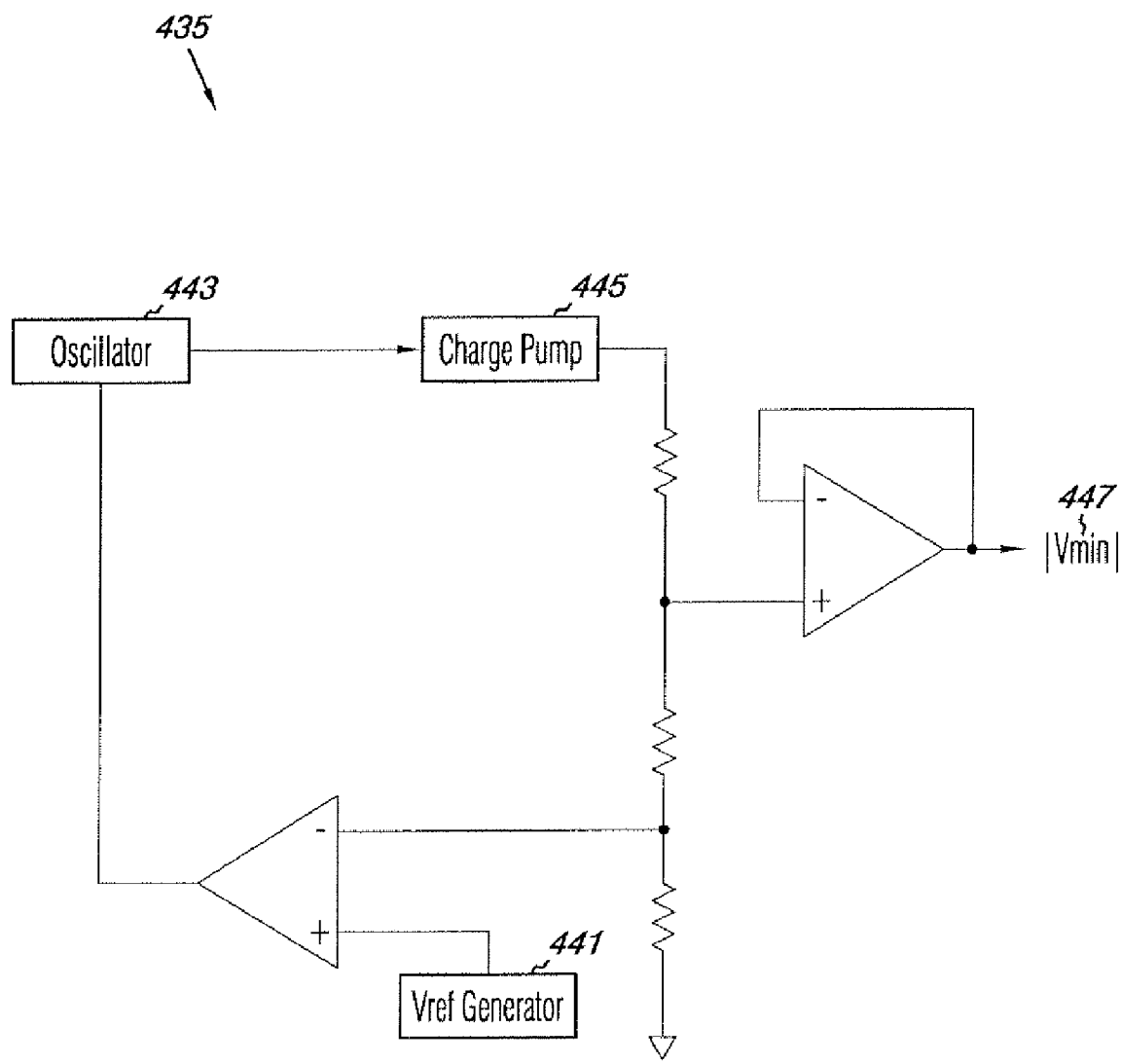
FIG. 4 illustrates a diagram of an embodiment for generating a source line boost voltage according to the present disclosure.

In various embodiments, the sense and read circuitry 300 includes a boost voltage source 335 which generates a positive boost voltage that is applied to the common source line, e.g., S/L, during read and verify operations to determine the Vt of a selected cell, e.g., Vtcell. An example of a boost voltage source is illustrated in FIG. 4. As shown in FIG. 3B, the boost voltage can have a value equal to the absolute value of Vmin, e.g., a positive voltage having a magnitude equal to an erased Vt level. In some embodiments, the positive boost voltage is greater than 0V but less than the absolute value of Vmin. In such embodiments, the positive boost voltage may have a value between 0V and 3V, or between 0V and 2V, among other ranges.

The value of the boost voltage to be applied to the common source line, e.g., S/L, can depend on various factors such as the applied read potentials and/or a desired gate-to-source voltage (Vgs) threshold. For example, if the applied read potentials range from a lowermost read potential of 0V to an uppermost read potential, and the source line is biased at 0V, then the Vgs threshold is 0V. That is, the Vt of memory cells having Vts less than 0V, e.g., negative Vts, may not be determinable as the cells are in a conductive state, e.g., the cells do not switch from a non-conducting state to a conductive state as different read voltages are applied to their gates, e.g. word lines. As such, only the Vts of cells having Vts greater than the Vgs, e.g., 0V in this example, will be determinable based on the detection of the cell switching from a non-conducting to a conducting state.

In the above example, the Vgs threshold can be reduced to a negative voltage value by applying a positive boost voltage to the common source line S/L during a read or verify operation. For instance, a lowermost read potential of 0V applied to the selected cell and a positive boost voltage, e.g., 1V or 2V, applied to the common source line S/L of the selected cell can result in a Vgs threshold of −1V or −2V, respectively. In this example, when the Vgs threshold is −1V, the Vts of cells having Vt levels between −1V and Vmax can be determined, and when the Vgs threshold is −2V, the Vts of cells having Vt levels between −2V and Vmax can be determined. As described herein, determining the Vts of cells having negative Vt levels can allow for cells to be programmed to negative program states, e.g., 322-1 and 322-2. The use of both negative and positive program states can provide benefits such as increasing the number of bits a cell can store, e.g., increasing the number of Vt distributions within a programming window, e.g., programming window 325, and/or can increase program and read accuracy by providing a greater voltage margin between adjacent Vt distributions.

As shown in the embodiment illustrated in FIG. 3B, during a read or program verify operation, a pass voltage Vpass, e.g., 4.5V, is applied to the word lines of unselected cells such that the unselected cells are in an electrically conductive state. In various embodiments, a ground potential, e.g., 0V, is applied to the semiconductor substrate, e.g., P-well or N-well region, in which the selected cell is formed.

In various embodiments, a voltage greater than the voltage applied to the source line, e.g., a voltage greater than the boost voltage, is applied to the bit line B/L of the selected cell during a read or verify operation. The voltage applied to the bit line B/L can have a value of about 1V or 2V greater than the boost voltage, but embodiments are not so limited. As previously mentioned, in various embodiments, the voltage applied to the bit line B/L can be a precharged voltage that can discharge as a selected cell transitions from a non-conducting to a conducting state during a read or verify operation.

The sense and read circuitry 300 can be used to detect whether a selected memory cell changes from an electrically non-conducting state to an electrically conducting state in response to the particular read voltage applied to the word line of the selected cell. That is, sense amplifier 330 can detect a current or voltage variation on the bit line B/L when the selected cell becomes electrically conductive, e.g., when the Vgs of the selected cell switches from a value less than the Vt of the selected cell to a value greater than the Vt of the selected cell in response to a particular read voltage applied to the selected word line. As described herein, the sense and read circuitry 300 can include a boost voltage source 335 that can apply a positive boost voltage to the common source line S/L such that both negative and positive Vt levels can be determined.

The sense amplifier 330 can signal verify/read circuitry 332 when the selected cell becomes conductive, e.g., when a voltage or current variation is detected on the bit line B/L. The verify/read circuitry 332 can then determine the Vt of the selected cell based on the particular voltages applied to the selected cell. The verify/read circuitry 332 then determines and outputs data stored in the selected cell based on the Vt level of the selected cell, e.g., based on which of the program Vt distributions 322-1 to 322-N the Vt of the cell corresponds with.

In this manner, the sense and read circuitry 300 can be used in conjunction with a program verify operation to determine, e.g., verify, when the Vt of a selected cell, e.g., Vtcell, has reached a particular verify level, e.g., Vv1 to VvN, corresponding to a particular programmed state, e.g., 322-1 to 322-N. Similarly, the sense and read circuitry 300 can be used in conjunction with a read operation to determine whether the Vt of the selected cell is greater than a read reference voltage, e.g., RD1 to RDN. For example, if a read operation performed by sense and read circuitry results in a determination that the Vt of the selected cell is between RD1 and RD2, then the verify/read circuitry 332 outputs the data, e.g., logical state, represented by program Vt distribution 322-1. Therefore, the sense and read circuitry 300 can utilize an expanded programming window 325 by reading Vt levels of memory cells programmed to negative programmed states, e.g., 322-1 and 322-2, and memory cells programmed to positive programmed states, e.g., 322-3 to 322-N.

FIG. 4 illustrates a diagram of an embodiment for generating a source line boost voltage according to the present disclosure. In the embodiment illustrated in FIG. 4, the boost voltage source 435 includes a reference voltage (Vref) generator 441, an electronic oscillator 443 and a charge pump 445. The reference voltage generator provides an input to a first operational amplifier whose output is received by the electronic oscillator 443. The output of the oscillator 443 is received by the charge pump 445 whose output is coupled to the negative input of the first operational amplifier and to the positive input of a second operational amplifier. The second operational amplifier outputs a positive boost voltage 447 that is fed back to the negative input of the second operational amplifier.

In various embodiments, the boost voltage source 435 supplies a positive boost voltage 447, e.g., 1.0V, 1.5V, 2.0V, or 3.0V, to the common source line of a NAND string of memory cells, e.g., as described above in FIG. 3B. In the embodiment illustrated in FIG. 4, the boost voltage source 435 outputs a boost voltage 447 having a value equal to the absolute value of Vmin, e.g., a voltage equal in magnitude but opposite in polarity to a negative Vt level corresponding to an erase state as shown in FIG. 3A.

As noted above, in various embodiments, the boost voltage 447 can have a value less than the absolute value of Vmin. For instance, if Vmin, e.g., a voltage corresponding to an erase Vt distribution, has a value of −3V, the boost voltage can have a value of 1V or 2V, depending on factors such as the voltage levels corresponding to negative programmed states, e.g., 322-1 and 322-2 shown in FIG. 3A, among other factors.

Figure 5:
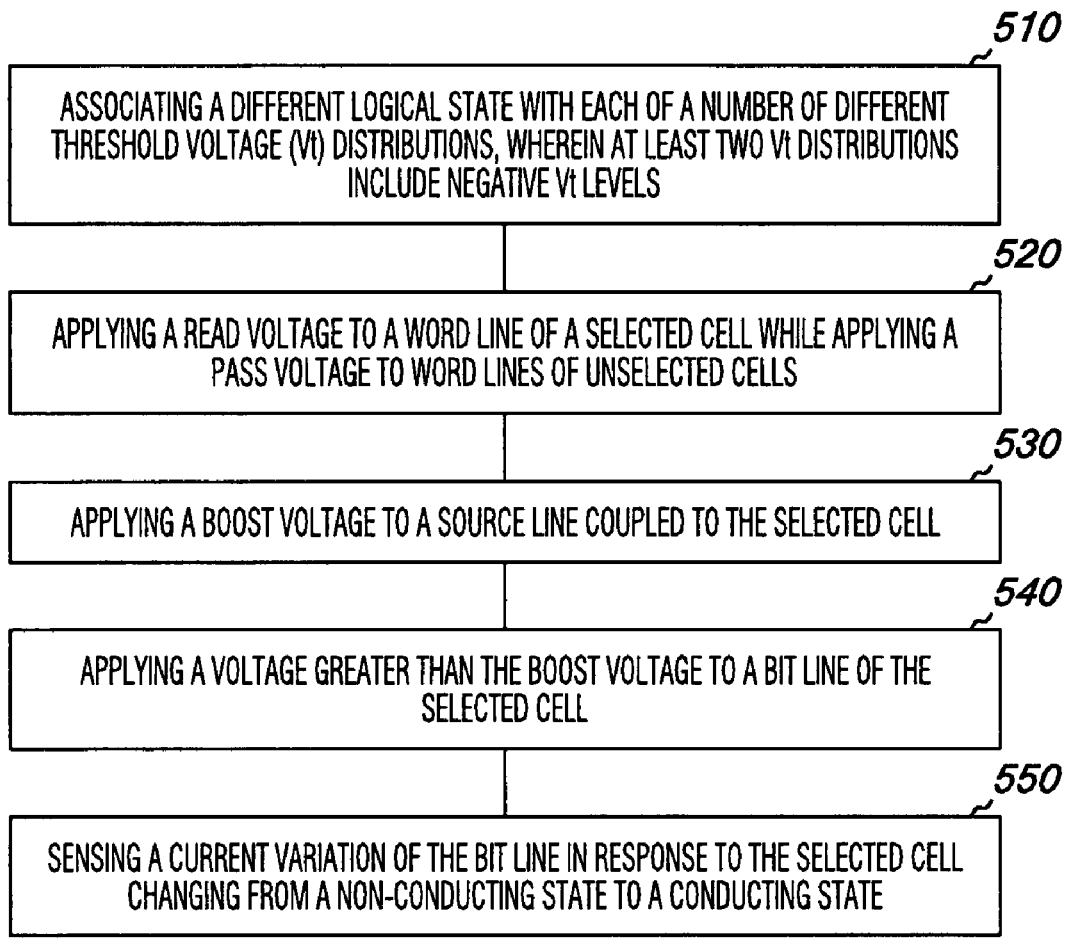
FIG. 5 is a block diagram of a method for determining threshold voltages of non-volatile multilevel memory cells according to an embodiment of the present disclosure.

FIG. 5 is a block diagram of a method for determining threshold voltages of non-volatile multilevel memory cells according to an embodiment of the present disclosure. In various embodiments, the multilevel memory cells can be arranged in an array having rows coupled by word lines and columns coupled by bit lines as shown in FIG. 1, for example.

As shown at block 510, the method can include associating a different logical state with each of a number of different threshold voltage (Vt) distributions. In various embodiments, at least two of the Vt distributions include negative Vt levels. That is, at least two of the Vt distributions include a range of negative voltage values. For example, in the embodiment shown in FIG. 3A, three Vt distributions, e.g., 310, 322-1, and 322-2 include a range of negative voltage values. In FIG. 3B, Vt distribution 310 represents an erase state, while Vt distributions 322-1 and 322-2 represent negative programmed states.

At block 520 the method includes applying a read voltage to a word line of a selected cell while applying a pass voltage to word lines of unselected cells. In various embodiments, the read voltage is a positive read voltage and the pass voltage is a positive pass voltage. The positive read voltage can be within a range from a lowermost voltage, e.g., 0V, to an uppermost voltage corresponding to an uppermost positive programmed state, e.g., 322-N shown in FIG. 3A. The uppermost positive programmed state can have a corresponding uppermost positive programmed Vt level, e.g., Vmax shown in FIG. 3A. In various embodiments, the lowermost read voltage is 0V and the uppermost read voltage is the sum of the uppermost positive programmed Vt level and the boost voltage.

The selected cell can have a Vt between a lowermost negative Vt level, e.g., Vmin shown in FIG. 3A, corresponding to an erase state and an uppermost positive Vt level, e.g., Vmax shown in FIG. 3A, corresponding to the uppermost program state of a number of program states.

At block 530 the method includes applying a boost voltage to a source line, e.g., a common source line, coupled to the selected cell. The boost voltage can be a positive boost voltage and can be generated by a boost voltage source such as source 435 illustrated in FIG. 4. In various embodiments, the positive boost voltage has a magnitude about equal to an erased Vt level and has the opposite polarity of the erased Vt level. In such embodiments, the erased Vt level can correspond to an uppermost boundary of the erase Vt distribution, e.g., 310 shown in FIG. 3A. The erased Vt level can have a value between −2V and −3V, for example. In various embodiments, the positive boost voltage has a magnitude between 0V and 3V. In some embodiments, applying the positive boost voltage to the source line includes applying a positive voltage equal in magnitude to a lowermost negative Vt level, e.g., Vmin shown in FIG. 3A.

At block 540 the method includes applying a voltage greater than the boost voltage to a bit line of the selected cell. In various embodiments, the voltage applied to the bit line of the selected cell is a precharged voltage. In such embodiments, the precharged bit line voltage can be discharged as the selected cell turns on, e.g., changes from an electrically non-conducting state to an electrically conducting state.

In various embodiments, the method includes applying a ground potential to a well region of a semiconductor substrate in which the selected cell is formed. The ground potential, e.g., 0V, can be applied to the well region during application of the read voltage to the selected word line, the pass voltage to the unselected word lines, the boost voltage to the common source line, and the bit line voltage to the bit line, e.g., common drain node.

At block 550, the method includes sensing a current variation of the bit line in response to the selected cell changing from a non-conducting state to a conducting state. Various embodiments of the present disclosure can be used to detect a current or voltage variation of the bit line for cells programmed to both negative Vt levels and positive Vt levels to thereby utilize an expanded programming window.

As described above in connection with FIGS. 3A and 3B, in various embodiments, the gate-to-source voltage (Vgs) threshold can be a negative value in order to read the Vt of cells programmed to negative program states, e.g., 321-1 and 322-2 shown in FIG. 3A. As described in connection with FIGS. 3A, 3B, and 4, the method can include determining the logical state of the selected cell based on the read voltage applied to the word line of the selected cell when the cell changes from the non-conducting to the conducting state.

In various embodiments of the present disclosure, a particular positive read voltage, e.g., 0V, 0.4V, 0.8V, 1.2V, 2.4V, 3.0V, etc., can be applied to a selected word line, e.g., the control gate of a selected memory cell, during a read operation or program verify operation. In various embodiments, a different positive read voltage, e.g., a voltage greater than the prior read voltage, can be applied to the selected word line if the selected cell remains in the non-conducting state after the first read or verify operation. In various embodiments, the method can include applying a number of different increasing positive read voltages to the word line of the selected cell until the cell changes to the conducting state, e.g., until the Vgs of the selected cell switches from a value less than the Vt of the selected cell to a value greater than the Vt of the selected cell.

Figure 6:
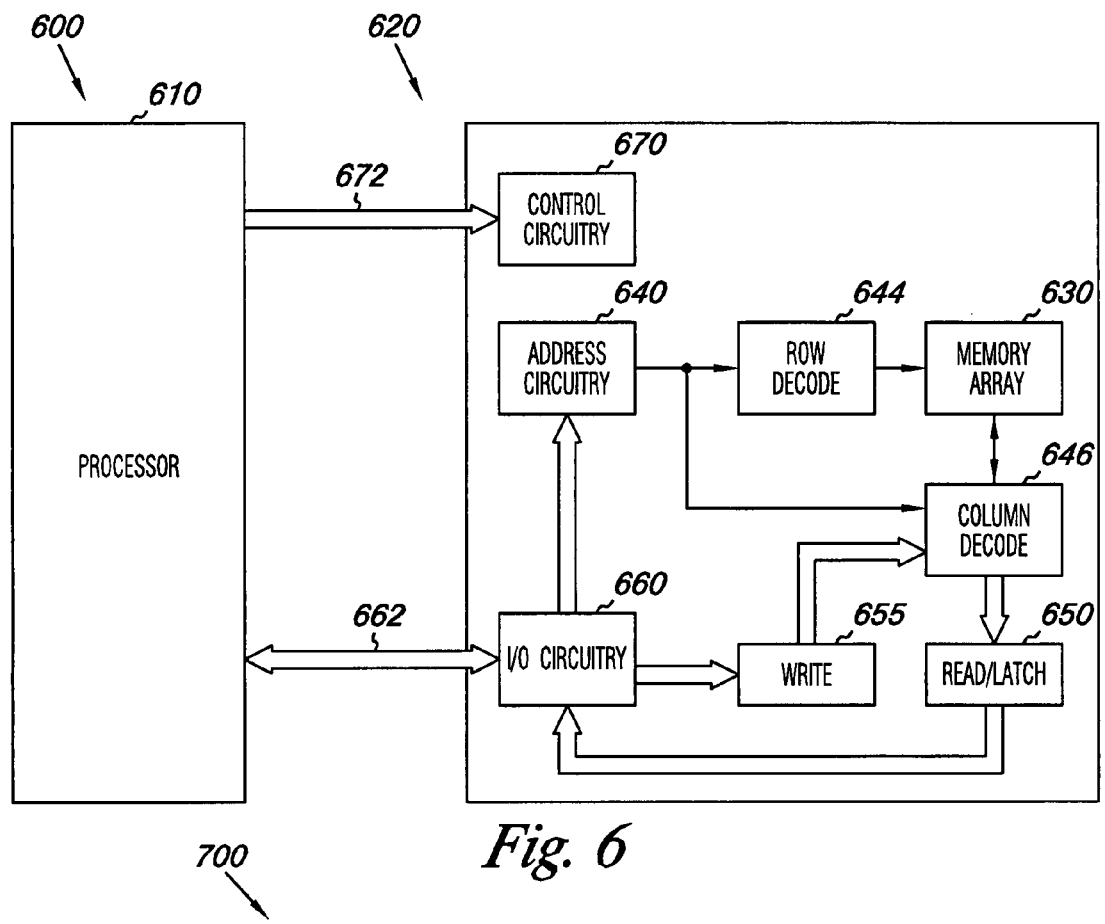
FIG. 6 is a functional block diagram of an electronic memory system having at least one memory device in accordance with an embodiment of the present disclosure.

FIG. 6 is a functional block diagram of an electronic memory system 600 having at least one memory device 620 in accordance with an embodiment of the present disclosure. Memory system 600 includes a processor 610 coupled to a non-volatile memory device 620 that includes a memory array 630 of non-volatile cells. The memory system 600 can include separate integrated circuits or both the processor 610 and the memory device 620 can be on the same integrated circuit. The processor 610 can be a microprocessor or some other type of controlling circuitry such as an application-specific integrated circuit (ASIC).

For clarity, the electronic memory system 600 has been simplified to focus on features with particular relevance to the present disclosure. The memory device 620 includes an array of non-volatile memory cells 630, which can be floating gate flash memory cells with a NAND architecture. The control gates of each row of memory cells are coupled with a word line, while the drain regions of the memory cells are coupled to bit lines. The source regions of the memory cells are coupled to source lines, as the same has been illustrated in FIG. 1. As will be appreciated by those of ordinary skill in the art, the manner of connection of the memory cells to the bit lines and source lines depends on whether the array is a NAND architecture, a NOR architecture, and NAND architecture, or some other memory array architecture.

The embodiment of FIG. 6 includes address circuitry 640 to latch address signals provided over I/O connections 662 through I/O circuitry 660. Address signals are received and decoded by a row decoder 644 and a column decoder 646 to access the memory array 630. In light of the present disclosure, it will be appreciated by those skilled in the art that the number of address input connections depends on the density and architecture of the memory array 630 and that the number of addresses increases with both increased numbers of memory cells and increased numbers of memory blocks and arrays.

The memory array 630 of non-volatile cells can include non-volatile multilevel memory cells read and/or verified according to embodiments described herein. The memory device 620 reads data in the memory array 630 by sensing voltage and/or current changes in the memory array columns, e.g., bit lines, using sense/buffer circuitry, e.g., sense and read circuitry 300 shown in FIG. 3B. In this embodiment, the sense/buffer circuitry can be read/latch circuitry 650. The read/latch circuitry 650 can be coupled to read and latch a row of data from the memory array 630. I/O circuitry 660 is included for bi-directional data communication over the I/O connections 662 with the processor 610. Write circuitry 655 is included to write data to the memory array 630.

Control circuitry 670 decodes signals provided by control connections 672 from the processor 610. These signals can include chip signals, write enable signals, and address latch signals that are used to control the operations on the memory array 630, including data read, data write, data verify, and data erase operations. In various embodiments, the control circuitry 670 is responsible for executing instructions from the processor 610 to perform the operating and programming embodiments of the present disclosure. The control circuitry 670 can be a state machine, a sequencer, or some other type of controller. It will be appreciated by those skilled in the art that additional circuitry and control signals can be provided, and that the memory device detail of FIG. 6 has been reduced to facilitate ease of illustration.

Figure 7:
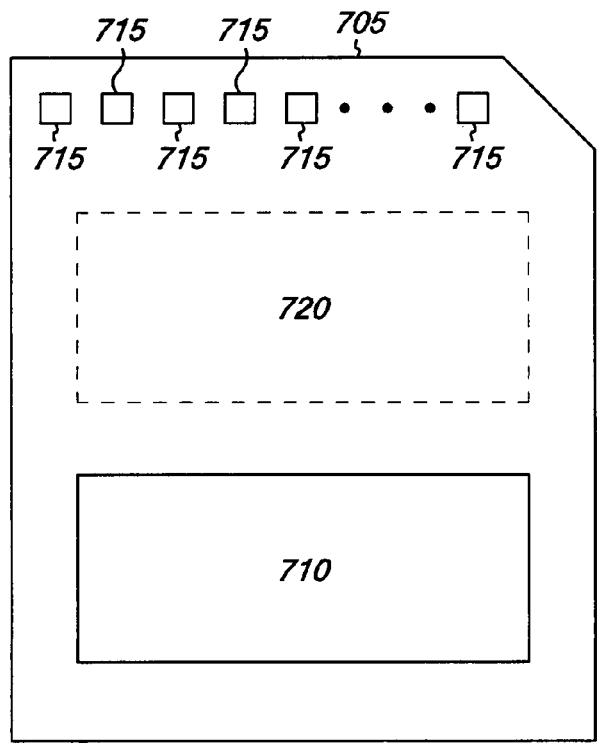
FIG. 7 is a functional block diagram of a memory module having at least one memory device in accordance with an embodiment of the present disclosure.

FIG. 7 is a functional block diagram of a memory module 700 having at least one memory device 710 in accordance with an embodiment of the present disclosure. Memory module 700 is illustrated as a memory card, although the concepts discussed with reference to memory module 700 are applicable to other types of removable or portable memory (e.g., USB flash drives) and are intended to be within the scope of "memory module" as used herein. In addition, although one example form factor is depicted in FIG. 7, these concepts are applicable to other form factors as well.

In some embodiments, memory module 700 will include a housing 705 (as depicted) to enclose one or more memory devices 710, though such a housing is not essential to all devices or device applications. At least one memory device 710 includes an array of non-volatile multilevel memory cells read and/or verified according to embodiments described herein. Where present, the housing 705 includes one or more contacts 715 for communication with a host device. Examples of host devices include digital cameras, digital recording and playback devices, PDAs, personal computers, memory card readers, interface hubs and the like. For some embodiments, the contacts 715 are in the form of a standardized interface. For example, with a USB flash drive, the contacts 715 might be in the form of a USB Type-A male connector. For some embodiments, the contacts 715 are in the form of a semi-proprietary interface, such as might be found on CompactFlash™ memory cards licensed by SanDisk Corporation, Memory Stick™ memory cards licensed by Sony Corporation, SD Secure Digital™ memory cards licensed by Toshiba Corporation and the like. In general, however, contacts 715 provide an interface for passing control, address and/or data signals between the memory module 700 and a host having compatible receptors for the contacts 715.

The memory module 700 may optionally include additional circuitry 720, which may be one or more integrated circuits and/or discrete components. For some embodiments, the additional circuitry 720 may include a memory controller for controlling access across multiple memory devices 710 and/or for providing a translation layer between an external host and a memory device 710. For example, there may not be a one-to-one correspondence between the number of contacts 715 and a number of 710 connections to the one or more memory devices 710. Thus, a memory controller could selectively couple an I/O connection (not shown in FIG. 7) of a memory device 710 to receive the appropriate signal at the appropriate I/O connection at the appropriate time or to provide the appropriate signal at the appropriate contact 715 at the appropriate time. Similarly, the communication protocol between a host and the memory module 700 may be different than what is required for access of a memory device 710. A memory controller could then translate the command sequences received from a host into the appropriate command sequences to achieve the desired access to the memory device 710. Such translation may further include changes in signal voltage levels in addition to command sequences.

The additional circuitry 720 may further include functionality unrelated to control of a memory device 710 such as logic functions as might be performed by an ASIC. Also, the additional circuitry 720 may include circuitry to restrict read or write access to the memory module 700, such as password protection, biometrics or the like. The additional circuitry 720 may include circuitry to indicate a status of the memory module 700. For example, the additional circuitry 720 may include functionality to determine whether power is being supplied to the memory module 700 and whether the memory module 700 is currently being accessed, and to display an indication of its status, such as a solid light while powered and a flashing light while being accessed. The additional circuitry 720 may further include passive devices, such as decoupling capacitors to help regulate power requirements within the memory module 700.

CONCLUSION

Methods, devices, modules, and systems for operating multilevel non-volatile memory cells have been shown. The cells can be programmed to a number of different negative and positive Vt distributions corresponding to a number of different logical states. One method embodiment includes applying a read voltage to a word line of a selected cell while applying a pass voltage to word lines of unselected cells, applying a boost voltage to a source line coupled to the selected cell, applying a voltage greater than the boost voltage to a bit line of the selected cell, and sensing a current variation of the bit line in response to the selected cell changing from a non-conducting state to a conducting state.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed:

1. A method for operating non-volatile multilevel memory cells, comprising:
    associating a different logical state with each of a number of different threshold voltage (Vt) distributions, wherein at least two Vt distributions include negative Vt levels;
    applying a read voltage to a word line of a selected cell while applying a pass voltage to word lines of unselected cells;
    applying a boost voltage to a source line coupled to the selected cell;
    applying a voltage greater than the boost voltage to a bit line of the selected cell;
    applying a ground potential to a well region of a semiconductor substrate in which the selected cell is formed; and sensing a current variation of the bit line in response to the selected cell changing from a non-conducting state to a conducting state.

2. The method of claim 1, wherein the method includes:
applying a positive read voltage to the word line of the selected cell while applying a positive pass voltage to word lines of unselected cells; and
applying a positive boost voltage to the source line coupled to the selected cell.

3. The method of claim 2, wherein the method includes applying the positive read voltage to the word line of a selected cell having a negative Vt level.

4. The method of claim 2, wherein the method includes:
applying a particular positive read voltage to the word line of the selected cell; and
sensing a current variation of the bit line based on the particular positive read voltage applied when the current variation occurs.

5. The method of claim 1, wherein the method includes determining the logical state of the selected cell based on the read voltage applied to the word line of the selected cell when the cell changes from the non-conducting to the conducting state.

6. A method for operating non-volatile multilevel memory cells, comprising:
applying a positive read voltage to a word line of a selected cell while applying a pass voltage to word lines of unselected cells, wherein the selected cell has:
a threshold voltage (Vt) between a lowermost negative Vt corresponding to an erase state;
an uppermost positive Vt corresponding to an uppermost program state of a number of program states; and
wherein the number of program states includes a program state having a corresponding negative Vt;
applying a positive boost voltage to a source line coupled to the selected cell;
applying a voltage greater than the positive boost voltage to a bit line of the selected cell;
applying a ground potential to a well region of a semiconductor substrate in which the selected cell is formed;
detecting whether the selected cell changes from a non-conducting state to a conducting state in response to the applied positive read voltage if the Vt of the selected cell is a positive voltage; and
detecting whether the selected cell changes from the non-conducting state to the conducting state in response to the applied positive read voltage if the Vt of the selected cell is a negative voltage corresponding to one of the number of program states.

7. The method of claim 6, wherein the detecting includes sensing a voltage variation of a bit line node in response to the selected cell changing from the non-conducting state to the conducting state.

8. The method of claim 6, wherein the detecting includes sensing a current variation of the bit line in response to the selected cell changing from the non-conducting state to the conducting state.

9. The method of claim 6, wherein the method includes applying the voltage greater than the positive boost voltage to the bit line of the selected cell includes applying a precharged voltage to the bit line.

10. The method of claim 6, wherein applying the positive boost voltage to the source line includes applying a positive voltage equal in magnitude to the lowermost negative Vt.

11. The method of claim 6, wherein the method includes applying a different positive read voltage to the word line of the selected cell if the selected cell remains in the non-conducting state.

12. The method of claim 11, wherein the method includes applying a number of different increasing positive read voltages to the word line of the selected cell until the cell changes to the conducting state.

13. The method of claim 12, wherein applying the number of different increasing positive read voltages includes applying voltages between 0V and a voltage obtained by summing up the uppermost positive Vt and the absolute value of the lowermost negative Vt.

14. A non-volatile memory device comprising:
an array of non-volatile multilevel memory cells arranged in rows coupled by word lines and columns coupled by bit lines; and
control circuitry coupled to the array and configured to execute a method for determining cell threshold voltage (Vt) levels of cells programmed from an erased Vt level to a programmed Vt level of a number of positive and negative programmed Vt levels, wherein the method includes:
applying a read voltage to a word line of a selected cell while applying a pass voltage to a number of word lines of unselected cells, applying a ground potential to a well region of a semiconductor substrate in which the selected cell is formed, applying a boost voltage to a source line coupled to the selected cell, and applying a voltage greater than the boost voltage to a bit line of the selected cell; and
sensing a current variation of the bit line in response to the selected cell changing from a non-conducting state to a conducting state.

15. The device of claim 14, wherein the method includes determining the Vt level of the selected cell during a program verify operation such that the read voltage is a verify voltage corresponding to one of the number of positive and negative programmed Vt levels.

16. The device of claim 14, wherein the boost voltage has a magnitude about equal to the erased Vt level and has the opposite polarity of the erased Vt level.

17. The device of claim 14, wherein the boost voltage is 1V to 2V; the erased Vt level is −2V to −4V; an uppermost positive programmed Vt level is 2V to 4V; and the read voltage is 0V to the sum of the uppermost positive programmed Vt level and the boost voltage.

18. The device of claim 14, wherein the method includes determining the Vt of the selected cell based on the read voltage applied to the word line of the selected cell when the selected cell changes from the non-conducting state to the conducting state.

19. A non-volatile memory device comprising:
an array of non-volatile multilevel memory cells arranged in rows coupled by word lines and columns coupled by bit lines; and
control circuitry coupled to the array and configured to execute a method for determining cell threshold voltage (Vt) levels of cells programmed from an erased Vt level to a programmed Vt level of a number of positive and negative programmed Vt levels, wherein the method includes:
applying a boost voltage to a source line coupled to a selected cell, the boost voltage being a positive voltage having a magnitude not greater than the magnitude of the erased Vt level;

applying a read voltage to a word line of the selected cell, the read voltage being in a range from at least 0V to a voltage obtained by summing the uppermost positive programmed Vt level and the boost voltage;

applying a pass voltage to a number of word lines of unselected cells, applying a ground potential to a well region of a semiconductor substrate in which the selected cell is formed, and applying a voltage greater than the boost voltage to a bit line of the selected cell; and detecting whether the selected cell changes from a non-conducting state to a conducting state in response to the applied read voltage if the Vt of the selected cell is at a positive programmed Vt level and if the selected cell is at a negative programmed Vt level.

20. The device of claim 19, wherein:
the erased Vt level is a negative voltage corresponding to an erased Vt distribution;
the positive programmed Vt levels are positive voltages corresponding to programmed Vt distributions; and
the negative programmed Vt levels are negative voltages corresponding to programmed Vt distributions.

21. The device of claim 19, wherein the voltage applied to the bit line is a precharged voltage.

22. The device of claim 20, wherein detecting whether the selected cell changes from the non-conducting state to the conducting state includes sensing a voltage variation of a bit line node.

* * * * *